(12) United States Patent
Bae et al.

(10) Patent No.: US 11,614,495 B2
(45) Date of Patent: *Mar. 28, 2023

(54) BATTERY STATE ESTIMATING APPARATUS

(71) Applicant: LG Energy Solution, Ltd., Seoul (KR)

(72) Inventors: Yoon-Jung Bae, Daejeon (KR); Hye-Jin Kang, Daejeon (KR)

(73) Assignee: LG Energy Solution, Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/272,390

(22) PCT Filed: Feb. 27, 2020

(86) PCT No.: PCT/KR2020/002841
§ 371 (c)(1),
(2) Date: Mar. 1, 2021

(87) PCT Pub. No.: WO2020/189914
PCT Pub. Date: Sep. 24, 2020

(65) Prior Publication Data
US 2021/0325476 A1     Oct. 21, 2021

(30) Foreign Application Priority Data

Mar. 18, 2019   (KR) .................. 10-2019-0030708

(51) Int. Cl.
*G01R 31/392*     (2019.01)
*G01R 31/396*     (2019.01)
(Continued)

(52) U.S. Cl.
CPC .......... *G01R 31/392* (2019.01); *G01R 19/12* (2013.01); *G01R 31/3835* (2019.01); *G01R 31/396* (2019.01)

(58) Field of Classification Search
None
See application file for complete search history.

(56) References Cited

U.S. PATENT DOCUMENTS

2007/0252600 A1   11/2007   Chou et al.
2010/0036626 A1   2/2010    Kang et al.
(Continued)

FOREIGN PATENT DOCUMENTS

JP     2005172784 A     6/2005
JP     2006015914 A     1/2006
(Continued)

OTHER PUBLICATIONS

Extended European Search Report including Written Opinion for Application No. 20774638.9 dated Oct. 5, 2021, pp. 1-6.
(Continued)

*Primary Examiner* — Jas A Sanghera
(74) *Attorney, Agent, or Firm* — Lerner, David, Littenberg, Krumholz & Mentlik, LLP

(57) ABSTRACT

A battery state estimating apparatus includes: a voltage measuring unit configured to measure a voltage of a battery cell and measure an open circuit voltage (OCV) of the battery cell whenever the measured voltage reaches a reference discharge voltage; and a control unit configured to receive the OCV measured by the voltage measuring unit, compare the received OCV with a pre-stored reference voltage to calculate a voltage fluctuation rate, determine a voltage increase and decrease pattern based on the calculated voltage fluctuation rate and pre-stored voltage fluctuation rate data, and determine a degradation acceleration degree of the battery cell according to the determined voltage increase and decrease pattern.

13 Claims, 5 Drawing Sheets

(51) Int. Cl.
  *G01R 31/3835* (2019.01)
  *G01R 19/12* (2006.01)

(56) References Cited

U.S. PATENT DOCUMENTS

| | | |
|---|---|---|
| 2010/0042345 A1 | 2/2010 | Kang et al. |
| 2010/0156351 A1* | 6/2010 | Ugaji .................. G01R 31/392 320/132 |
| 2013/0069598 A1 | 3/2013 | Tanaka et al. |
| 2013/0166233 A1 | 6/2013 | Suh et al. |
| 2013/0218496 A1 | 8/2013 | Koch et al. |
| 2013/0314050 A1 | 11/2013 | Matsubara et al. |
| 2015/0268309 A1 | 9/2015 | Kim |
| 2016/0088563 A1 | 3/2016 | Koo et al. |
| 2016/0190658 A1 | 6/2016 | Ishibashi et al. |
| 2017/0146609 A1 | 5/2017 | Uchino et al. |
| 2018/0299511 A1* | 10/2018 | Kim ..................... G01R 31/392 |
| 2019/0219641 A1 | 7/2019 | Iwane et al. |
| 2021/0218262 A1* | 7/2021 | Bae ........................ H02J 7/005 |

FOREIGN PATENT DOCUMENTS

| | | |
|---|---|---|
| JP | 6099918 B2 | 3/2017 |
| JP | 6171821 B2 | 8/2017 |
| JP | 2018014210 A | 1/2018 |
| KR | 100927541 B1 | 11/2009 |
| KR | 100970841 B1 | 7/2010 |
| KR | 20160011448 A | 2/2016 |
| KR | 20160033588 A | 3/2016 |
| KR | 101783918 B1 | 10/2017 |
| KR | 101835656 B1 | 3/2018 |
| KR | 20180099668 A | 9/2018 |
| WO | 2017087807 A1 | 5/2017 |
| WO | 2018056448 A1 | 3/2018 |

OTHER PUBLICATIONS

International Search Report for Application No. PCT/KR2020/002841 dated Jun. 17, 2020, 3 pgs.

* cited by examiner

BATTERY STATE ESTIMATING APPARATUS

CROSS-REFERENCE TO RELATED APPLICATIONS

The present application is a national phase entry under 35 U.S.C. § 371 of International Application No. PCT/KR2020/002841 filed Feb. 27, 2020, published in Korean, which claims priority from Korean Patent Application No. 10-2019-0030708 filed Mar. 18, 2019, all of which are incorporated herein by reference.

TECHNICAL FIELD

The present disclosure relates to a battery state estimating apparatus, and more particularly, to a battery state estimating apparatus for determining whether degradation of a battery cell is accelerated and also determining the degree of degradation acceleration.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at the present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In recent years, as secondary batteries are applied to more fields, the secondary batteries are widely used not only in small-sized portable devices such as smartphones but also in medium-sized and large-sized devices such as electric vehicles including hybrid electric vehicles, and power storage devices.

The performance of the secondary battery degrades as the use period increases, compared to the initial stage. In addition, estimating the degree of performance degradation of the secondary battery is said to estimate the state of health (SOH) of the secondary battery, and the SOH of the secondary battery is an important factor in determining the replacement time of the secondary battery.

Conventionally, in Korean Publication KR 10-2016-0011448A, there has been proposed a device and method for measuring an open circuit voltage (OCV) of a battery, integrating a current flowing into the battery until the battery is fully charged, and calculating a full charge capacity charged to the battery by using the integrated current amount and the measured OCV.

However, KR 10-2016-0011448A just discloses a configuration that determines the degree of degradation on how much a battery has degraded ex post facto by measuring the loss of the full charge capacity of the battery, and does not provide any more specific information related to the degradation of the battery such as a present degradation rate of the battery. That is, KR 10-2016-0011448A just provides a battery degradation degree, which is information for determining a present or past state of the battery, and but does not provide any specific information, for example, for determining a battery state at a future point in time, such as a predicted deterioration rate or a predicted lifetime of the battery.

SUMMARY

Technical Problem

The present disclosure is designed to solve the problems of the related art, and therefore the present disclosure is directed to providing a battery state estimating apparatus, which may provide specific information about degradation of a battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery state estimating apparatus, comprising: a voltage measuring unit configured to measure a voltage of a battery cell and measure an open circuit voltage (OCV) of the battery cell whenever the measured voltage reaches a reference discharge voltage; and a control unit configured to receive the OCV measured by the voltage measuring unit, compare the received OCV with a pre-stored reference voltage, calculate a voltage fluctuation rate according to the comparison between the received OCV and the pre-stored reference voltage, determine either a voltage increase pattern or a voltage decrease pattern based on the calculated voltage fluctuation rate and pre-stored voltage fluctuation rate data, and determine a degree to which degradation of the battery cell is changing according to the determined voltage increase pattern or voltage decrease pattern.

The pre-stored reference voltage may be an OCV of the battery cell when the battery cell is discharged to the reference discharge voltage during a predetermined cycle of the battery cell.

The pre-stored voltage fluctuation rate data may include a voltage fluctuation rate previously calculated by the control unit.

The control unit may be configured to calculate a rate of voltage change between the voltage fluctuation rate calculated during a present cycle of the battery cell and a voltage fluctuation rate calculated during a previous cycle of the battery cell within a predetermined number of cycles from the present cycle of the battery cell, wherein the voltage fluctuation rate calculated during the previous cycle is included among the pre-stored voltage fluctuation rate data, and determine the voltage increase pattern or voltage decrease pattern based on the calculated rate of voltage change.

The control unit may be configured to determine the degree to which degradation of the battery cell is changing as one of an accelerated degradation or a linear degradation according to the voltage increase pattern determined from the calculated rate of voltage change.

The control unit may be configured to determine the degree to which degradation of the battery cell is changing as a decelerated degradation, according to the voltage decrease pattern determined from the calculated rate of voltage change.

The control unit may be configured to determine the degree to which degradation of the battery cell is changing as the accelerated degradation based on the calculated rate of voltage change being equal to or greater than a preset reference rate of voltage change, and to determine the degree to which degradation of the battery cell is changing as the linear degradation based on the calculated rate of voltage change being smaller than the preset reference rate of voltage change.

The control unit may be configured to determine the voltage increase pattern or the voltage decrease pattern according to calculated voltage fluctuation rate and the pre-stored voltage fluctuation rate data based on the calculated voltage fluctuation rate being greater than a preset lower voltage limit and smaller than a preset upper voltage limit.

The control unit may be configured to calculate an electric resistance fluctuation rate based on the OCV and a pre-stored reference resistance, determine a resistance increase pattern or a resistance decrease pattern based on the calculated electric resistance fluctuation rate and pre-stored electric resistance fluctuation rate data, and determine the degree to which degradation of the battery cell is changing according to the determined voltage increase pattern or the determined voltage pattern and according to the determined resistance increase pattern or the determined resistance decrease pattern.

The pre-stored reference resistance may be calculated based on the pre-stored reference voltage.

The pre-stored electric resistance fluctuation rate data may include an electric resistance fluctuation rate previously calculated by the control unit.

The control unit may be configured to calculate a rate of resistance change between the electric resistance fluctuation rate calculated during a present cycle of the battery cell and an electric resistance fluctuation rate calculated during a previous cycle of the battery cell within a predetermined number of cycles from the present cycle of the battery cell, wherein the electric resistance fluctuation rate calculated during the previous cycle of the battery cell is included among the pre-stored electric resistance fluctuation rate data, and determine the resistance increase pattern or the resistance decrease pattern based on the calculated rate of resistance change.

The control unit may be configured to determine the degree to which degradation of the battery cell is changing as one of an accelerated degradation or a linear degradation according to the calculated rate of resistance change according to the voltage increase pattern and the resistance increase pattern.

The control unit may be configured to determine the resistance increase pattern or the resistance decrease pattern according to the voltage increase pattern and the calculated electric resistance fluctuation rate being greater than a preset lower resistance limit.

A battery pack according to another aspect of the present disclosure may include the battery state estimating apparatus according to any embodiment of the present disclosure.

An electric vehicle according to still another aspect of the present disclosure may include the battery state estimating apparatus according to any embodiment of the present disclosure.

Advantageous Effects

According to an aspect of the present disclosure, since not only the degradation degree of the battery cell but also the degradation acceleration degree of the battery cell is estimated, the present degradation state of the battery cell may be more accurately estimated, and the future degradation state of the battery cell may also be predicted more accurately.

In addition, according to one aspect of the present disclosure, since the degradation acceleration degree of the battery cell is classified into accelerated degradation, decelerated degradation and linear degradation and determined in detail, the degradation degree of the battery cell may be more specifically determined.

In addition, according to one aspect of the present disclosure, since the degradation acceleration degree of the battery cell is measured through various indexes, there is an advantage that the battery degradation degree may be more accurately determined or predicted.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
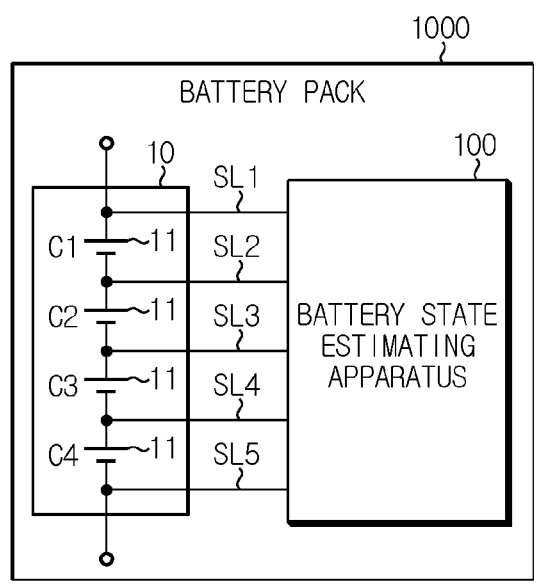
FIG. 1 is a diagram schematically showing a battery pack including a battery state estimating apparatus according to an embodiment of the present disclosure.

FIG. 1 is a diagram schematically showing a battery pack including a battery state estimating apparatus according to an embodiment of the present disclosure.

Referring to FIG. 1, a battery state estimating apparatus 100 according to an embodiment of the present disclosure may be electrically connected to a battery module 10 including at least one battery cell 11 to estimate the state of each battery cell 11. In addition, the battery state estimating apparatus 100 may be included in a battery pack 1000 together with the battery module 10. FIG. 1 shows an example in which one battery module 10 and one battery state estimating apparatus 100 are included in the battery pack 1000, but the number of battery modules 10 and battery state estimating apparatuses 100 included in the battery pack 1000 is not limited to the number shown in FIG. 1. Similarly, the number of battery cells 11 included in the battery module 10 is not limited to the number shown in FIG. 1.

Figure 2:
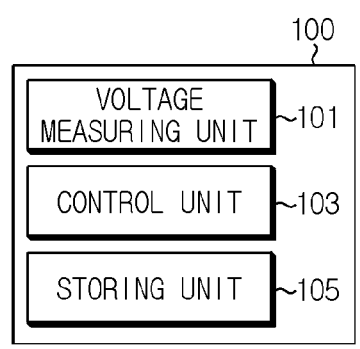
FIG. 2 is a block diagram schematically showing the battery state estimating apparatus according to an embodiment of the present disclosure.

The specific configuration of the battery state estimating apparatus 100 will be described with reference to FIG. 2. FIG. 2 is a block diagram schematically showing the battery state estimating apparatus according to an embodiment of the present disclosure.

Referring to FIG. 2, the battery state estimating apparatus 100 may include a voltage measuring unit 101 and a control unit 103. The voltage measuring unit 101 may measure a voltage of the battery cell 11 included in the battery module 10. That is, the voltage measuring unit 101 may be configured to measure the voltage of each battery cell 11 included in the battery module 10.

For example, in the embodiment shown in FIG. 1, the battery state estimating apparatus 100 may measure a voltage when a first battery cell C1, a second battery cell C2, a third battery cell C3 and a fourth battery cell C4 included in the battery module 10 are discharged, respectively. Specifically, the voltage measuring unit 101 may measure the voltage of the first battery cell C1 through a first sensing line SL1 and a second sensing line SL2, and measure the voltage of the second battery cell C2 through the second sensing line SL2 and a third sensing line SL3. In addition, the voltage measuring unit 101 may measure the voltage of the third battery cell C3 through the third sensing line SL3 and a fourth sensing line SL4, and measure the voltage of the fourth battery cell C4 through the fourth sensing line SL4 and a fifth sensing line SL5.

The voltage measuring unit 101 may measure an open circuit voltage (OCV) of the battery cell 11. That is, the voltage measuring unit 101 may measure both the voltage and the OCV of the battery cell 11. In particular, the voltage measuring unit 101 may measure the OCV of each battery cell 11 whenever the measured voltage reaches a reference discharge voltage. Here, the reference discharge voltage may be a voltage that is preset and stored by a user or the like so that the voltage measuring unit 101 may measure the OCV by using the same. That is, the reference discharge voltage is a reference value by which the OCV of the battery cell 11 may be measured by the voltage measuring unit 101, and may provide a time point when the voltage measuring unit 101 should measure the OCV of the battery cell 11. For example, the predetermined voltage can be set to 2.8 V. The voltage measuring unit 101 may measure voltages of the plurality of battery cells 11 and measure the OCVs of the battery cells 11 whenever the measured voltage of each battery cell 11 reaches the predetermined voltage.

For example, in the embodiment shown in FIG. 1, it is assumed that the reference discharge voltage is set to V1 [V] for each battery cell 11. At this time, if the voltage of the first battery cell C1 reaches V1 [V] by discharging, the voltage measuring unit 101 may measure the OCV of the first battery cell C1. Similarly, if the voltage of at least one of the second battery cell C2, the third battery cell C3 and the fourth battery cell C4 reaches V1 [V], the voltage measuring unit 101 may measure the OCV of the battery cell 11 whose voltage reaches V1 [V].

The control unit 103 may receive the OCV measured by the voltage measuring unit 101. The control unit 103 is configured to exchange electrical signals with the voltage measuring unit 101 inside the battery state estimating apparatus 100, and may receive the measured OCV from the voltage measuring unit 101.

The control unit 103 may calculate a voltage fluctuation rate by comparing the OCV received from the voltage measuring unit 101 with a pre-stored reference voltage. Here, the pre-stored reference voltage is a reference value for comparison with the OCV measured by the voltage measuring unit 101, and may be a value stored in advance. For example, the pre-stored reference voltage may include an OCV of the battery cell 11 measured at a predetermined cycle time point. The voltage fluctuation rate may be obtained by comparing the pre-stored reference voltage with the OCV received from the voltage measuring unit 101 by the control unit 103. In particular, the voltage fluctuation rate may be calculated as a ratio or difference between the pre-stored reference voltage and the measured value of OCV. That is, the control unit 103 may receive the measured OCV from the voltage measuring unit 101 in a cycle after the predetermined cycle and calculate a ratio of the received OCV to the pre-stored reference voltage as the voltage fluctuation rate.

For example, it is assumed that the pre-stored reference voltage for the first battery cell C1 is A1 [V]. In addition, it is assumed that the OCV of the first battery cell C1 measured by the voltage measuring unit 101 at a first time point is B1 [V]. The control unit 103 may calculate the voltage fluctuation rate at the first time point of the first battery cell C1 as the ratio of B1 to A1. For example, the voltage fluctuation rate of the first battery cell C1 at the first time point may be calculated as a calculation formula of "(B1÷A1)×100".

The control unit 103 may determine the voltage increase and decrease pattern based on the calculated voltage fluctuation rate and the pre-stored voltage fluctuation rate data. Here, the voltage fluctuation rate data is reference data for comparison with the calculated voltage fluctuation rate, and may be stored in advance. The control unit 103 may update the pre-stored voltage fluctuation rate data by adding the calculated voltage fluctuation rate to the pre-stored voltage fluctuation rate data. In addition, the control unit 103 may determine the voltage increase and decrease pattern based on the updated voltage fluctuation rate data.

For example, the pre-stored voltage fluctuation rate data may be data in which a voltage fluctuation rate previously calculated by the control unit 103 is stored. In this case, the control unit 103 may determine the voltage increase and decrease pattern of the battery cell 11 based on all voltage fluctuation rates calculated from the cycle at which the reference voltage is calculated. The voltage increase and decrease pattern may include various patterns such as a voltage increase pattern, a voltage decrease pattern and a voltage constant pattern. Hereinafter, for convenience of description, it will be described that the voltage increase and decrease pattern includes a voltage increase pattern and a voltage decrease pattern, and the voltage increase pattern includes patterns such as a voltage constant pattern excluding the voltage decrease pattern.

In addition, the control unit 103 may be configured to determine a degradation acceleration degree of the battery cell 11 according to the determined voltage increase and decrease pattern. Here, the degradation acceleration degree may be information indicating whether the degradation of the battery cell 11 is getting faster or slower. That is, the control unit 103 may determine the voltage increase and decrease pattern for the battery cell 11, and determine the degradation acceleration degree of the battery cell 11 based on the determined voltage increase and decrease pattern.

For example, the control unit 103 may determine the voltage increase and decrease pattern of the first battery cell C1, and determine the degradation acceleration degree of the first battery cell C1 according to the determined voltage increase and decrease pattern.

The battery state estimating apparatus 100 according to an embodiment of the present disclosure may determine the rate at which the present battery cell 11 is degrading by synthesizing the previous history thereof, without determining only the degradation degree based on the present state of the battery cell 11. Accordingly, the battery state estimating apparatus 100 according to an embodiment of the present disclosure may provide information capable of estimating the state of the battery cell 11 at a future time point, thereby helping to predict the life of the battery cell 11 or determine a future state.

In particular, the control unit 103 may independently determine the degradation acceleration degree for each battery cell 11. For example, the control unit 103 may separately determine voltage increase and decrease pattern for each of the first battery cell C1, the second battery cell C2, the third battery cell C3 and the fourth battery cell C4. In addition, the control unit 103 may separately determine the degradation acceleration degree for each of the first battery cell C1, the second battery cell C2, the third battery cell C3 and the fourth battery cell C4 according to the determined voltage increase and decrease pattern.

That is, since the battery state estimating apparatus 100 according to an embodiment of the present disclosure may independently determine the degradation acceleration degree of each battery cell 11, it is possible to determine the degradation degree and the degradation acceleration degree of each battery cell 11, also predict the life of each battery cell 11. Specifically, the battery state estimating apparatus 100 may calculate the degradation degree of each battery cell 11 by measuring the OCV of each battery cell 11 to calculate a loss capacity, and also may determine the degradation acceleration degree about how quickly each battery cell 11 is degraded. Accordingly, the battery state estimating apparatus 100 may estimate the future degradation degree of each battery cell 11 according to the degradation acceleration degree of the battery cell 11, and may also adjust and set the control conditions of each battery cell 11 according to the estimated degradation degree.

For example, even battery cells 11 of the same product line may not have exactly the same available capacity due to problems such as initial resistance variation or capacity variation. For example, it is assumed that the battery cells have a factory setting capacity of 1000 mAh, but the first battery cell C1 has an initial capacity of 900 mAh, and the second battery cell C2 has an initial capacity of 1000 mAh. If the present available capacities of the first battery cell C1 and the second battery cell C2 become equal to 800 mAh due to the use during the same period, even though the first battery cell C1 and the second battery cell C2 have the same available capacity, it is not accurate estimation of the state of the battery cell 11 to determine that both battery cells 11 have the same degradation degree due to the difference in initial capacity. In addition, even though the degradation degree of the first battery cell C1 is calculated to be about 11% and the degradation degree of the second battery cell C2 is calculated to be 20%, the calculated degradation degree is only meaningful as an index indicating only a present state of each of the first battery cell C1 and the second battery cell C2 according to the present capacity compared to the initial capacity, and is not suitable as an index for predicting a present degradation acceleration degree of each of the first battery cell C1 and the second battery cell C2 or a future situation such as an expected lifetime according to the degradation acceleration degree. That is, the ratio of the present capacity to the initial capacity of the battery cell 11 is only an index for ex post determination of the deterioration degree of the battery cell 11, and it is not suitable as an index for determining the degradation acceleration degree, the future deterioration rate, or the expected lifespan of the battery cell 11.

Meanwhile, the battery state estimating apparatus 100 according to an embodiment of the present disclosure may accurately determine a present state of the battery cell 11 by measuring the present OCV of the battery cell 11 and determining the degradation acceleration degree. In addition, the battery state estimating apparatus 100 has the advantage of determining the degradation acceleration degree of the battery cell 11 and taking measures such as changing the control conditions of the battery cell 11 so that the life of the battery cell 11 lasts longer.

Here, the control unit 103 may optionally include a processor, an application-specific integrated circuit (ASIC), another chipset, a logic circuit, a register, a communication modem, and a data processing device, and the like, known in the art to execute various control logics performed in the battery state estimating apparatus 100 according to an embodiment of the present disclosure. In addition, when the control logic is implemented in software, the control unit 103 may be implemented as a set of program modules. At this time, the program module may be stored in a memory and executed by the processor. The memory may be provided in or out of the processor, and may be connected to the processor by various well-known means. For example, the control unit 103 is a processor provided in the battery state estimating apparatus 100 according to an embodiment of the present disclosure, and may provide the determined degradation acceleration degree of the battery cell 11 to a user through an output device such as a display device. In addition, the control unit 103 may provide a notification for replacement or warning of the battery cell 11 to the user through an external notification device based on the degradation acceleration degree of the battery cell 11.

In addition, referring to FIG. 2, the battery state estimating apparatus 100 according to an embodiment of the present disclosure may further include a storing unit 105. The storing unit 105 may store the reference voltage. That is, the reference voltage is stored in the storing unit 105 in advance, and the control unit 103 may calculate a voltage fluctuation rate by comparing the reference voltage pre-stored in the storing unit 105 with the OCV received from the voltage measuring unit 101. In addition, the storing unit 105 may store the voltage fluctuation rate data. That is, the voltage fluctuation rate data calculated by the control unit 103 is stored in the storing unit 105, and the control unit 103 may determine the voltage increase and decrease pattern of the battery cell 11 based on the voltage fluctuation rate data pre-stored in the storing unit 105.

That is, the storing unit 105 may store data or programs required for each component of the battery state estimating apparatus 100 according to an embodiment of the present disclosure to operate and perform, such as the reference voltage measured by the voltage measuring unit 101 and the previous voltage fluctuation rate data calculated by the control unit 103. The storing unit 105 is not particularly limited in its kind as long as it is a known information storage means that may record, erase, update and read data. As an example, the information storage means may include a random-access memory (RAM), a flash memory, a read-only memory ROM, an electrically erasable programmable read-only memory (EEPROM), a register, and the like. The storing unit 105 may store program codes in which processes executable by the control unit 103 are defined.

Preferably, the pre-stored reference voltage may include an OCV when the battery cell 11 is discharged at a predetermined cycle so that the voltage of the battery cell 11 reaches the reference discharge voltage. Here, the predetermined cycle may be a time point within a predetermined number of cycles from BOL (Beginning Of Life), and, for example, may be a first discharge time point after shipment of the battery cell 11.

For example, it is assumed that the reference discharge voltage is set to 2.8 V. In this case, the voltage measuring unit 101 may measure a voltage in an initial discharge process (an initial state) of the first battery cell C1, and measure an OCV when the measured voltage reaches 2.8 V.

Preferably, the pre-stored voltage fluctuation rate data may be configured to include a voltage fluctuation rate calculated by control unit 103 whenever OCV is measured by the voltage measuring unit 101. That is, from the predetermined cycle to before the present time point, the voltage measuring unit 101 may measure OCV when the voltage of the battery cell 11 reaches the reference discharge voltage by discharging, and the control unit 103 may calculate a voltage fluctuation rate according to the OCV measured by the voltage measuring unit 101. In addition, the calculated voltage fluctuation rate may be included in the voltage fluctuation rate data pre-stored in the storing unit 105.

For example, in the embodiment shown in FIG. 1, the pre-stored voltage fluctuation rate data for the first battery cell C1 may include voltage fluctuation rates of the first battery cell C1 calculated from a first time point to an N-1$^{th}$ time point. Here, N is an integer of 2 or more, and when N is 2, the pre-stored voltage fluctuation rate data may include only the voltage fluctuation rate of the first battery cell C1 calculated at the first time point. If the voltage fluctuation rate of the first battery cell C1 is calculated at the N$^{th}$ time point by the control unit 103, the voltage fluctuation rate of the first battery cell C1 at the N$^{th}$ time point may be included in the voltage fluctuation rate data pre-stored in the storing unit 105. In this case, the voltage fluctuation rate data pre-stored in the storing unit 105 may include first to N$^{th}$ voltage fluctuation rates.

The battery state estimating apparatus 100 according to an embodiment of the present disclosure may determine a present voltage increase and decrease pattern of the battery cell 11 based on the voltage fluctuation rate data pre-stored in the storing unit 105 from the past time point to the present time point. That is, since the battery state estimating apparatus 100 according to an embodiment of the present disclosure determines the present voltage increase and decrease pattern and the present degradation acceleration degree of the battery cell 11 based on the pre-stored voltage fluctuation rate data in which the calculated voltage fluctuation rates are accumulatively stored, there is an advantage in that the degradation acceleration degree and the degradation degree of the battery cell 11 may be more accurately determined, compared to the case where the degradation degree of the battery cell 11 is determined only by the voltage fluctuation rate at a specific time point. In addition, since the determined degradation acceleration degree and the determined degradation degree may be utilized as information for estimating a future state of the battery cell 11, the battery state estimating apparatus 100 according to an embodiment of the present disclosure has an advantage of providing information capable of estimating a future state based on not only the past and present states but also the degradation acceleration degree of the battery cell 11.

The control unit 103 may calculate a rate of voltage change of a plurality of voltage fluctuation rates included within a predetermined number of cycles from the present cycle of the battery cell 11 among the pre-stored voltage fluctuation rate data. Here, the rate of voltage change may include an average rate of change or an instantaneous rate of change of the voltage fluctuation rates. In addition, the plurality of voltage fluctuation rates included within a predetermined number of cycles from the present cycle may include a plurality of voltage fluctuation rates included within a preset number of cycles from the present cycle. For example, the control unit 103 may calculate a rate of voltage change of a plurality of voltage fluctuation rates included within 50 cycles from the present cycle. The calculation of the rate of voltage change will be described in detail with reference to FIGS. 3 and 4.

Figure 3:
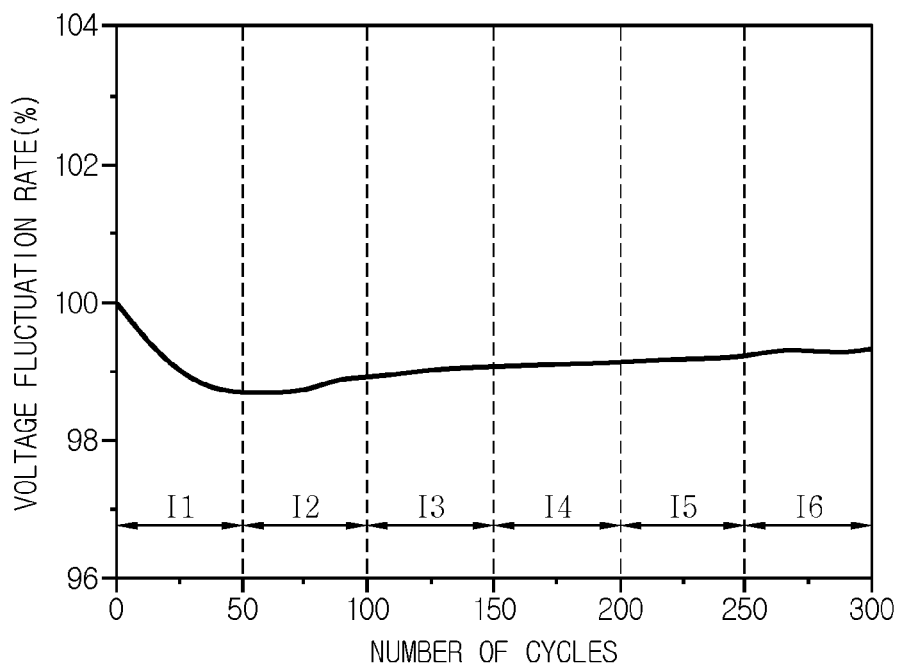
FIG. 3 is a diagram showing a voltage fluctuation rate of a first battery cell, calculated by the battery state estimating apparatus according to an embodiment of the present disclosure.
Figure 4:
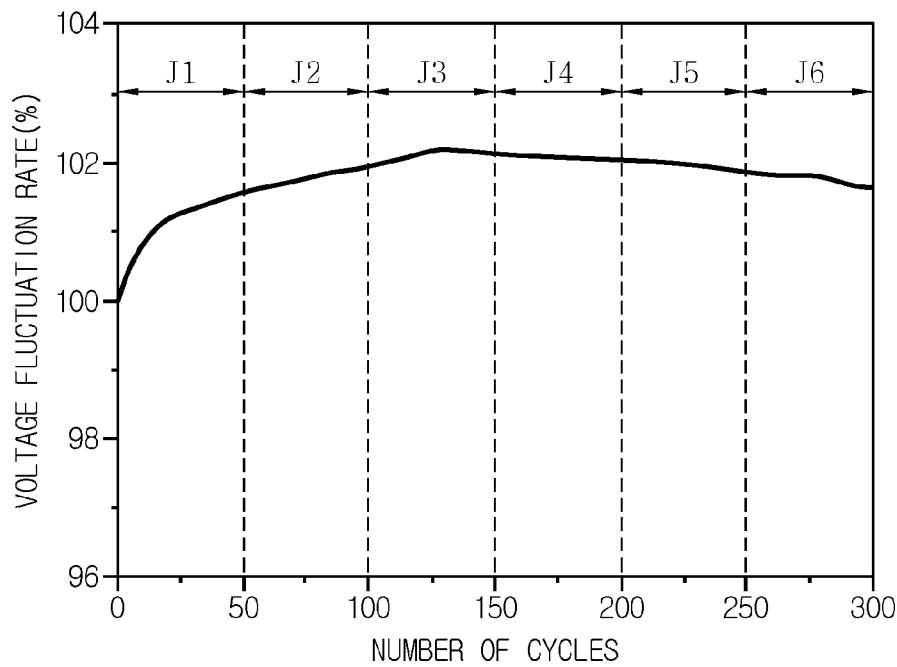
FIG. 4 is a diagram showing a voltage fluctuation rate of a second battery cell, calculated by the battery state estimating apparatus according to an embodiment of the present disclosure.

FIG. 3 is a diagram showing a voltage fluctuation rate of the first battery cell C1, calculated by the battery state estimating apparatus 100 according to an embodiment of the present disclosure. FIG. 4 is a diagram showing a voltage fluctuation rate of the second battery cell C2, calculated by the battery state estimating apparatus 100 according to an embodiment of the present disclosure. Referring to FIGS. 3 and 4, the storing unit 105 may store voltage fluctuation rate data pre-stored for the first battery cell C1 and voltage fluctuation rate data pre-stored for the second battery cell C2 at every cycle. Hereinafter, as shown in FIG. 3, a region including a preset number of cycles for the first battery cell C1 will be described as an In region. Similarly, as shown in FIG. 4, a region including a preset number of cycles for the second battery cell C2 will be described as a Jn region. Here, n is a positive integer. For example, if the preset number of cycles is 50, an I1 region may include 0 to 50 cycles of the first battery cell C1, and an I2 region may include 51 to 100 cycles of the first battery cell C1. For convenience of description, it is assumed that 0 cycle of the first battery cell C1 is included in I1 and 0 cycle of the second battery cell C2 is included in the J1 region.

For example, it is assumed that a preset number of cycles to be included in one region is 50. In FIG. 3, if the present cycle of the first battery cell C1 is 300 cycle, the control unit 103 may extract a voltage fluctuation rate of each cycle belonging to an I6 region including 251 to 300 cycles of the voltage fluctuation rate data pre-stored in the storing unit 105 for the first battery cell C1. That is, the control unit 103 may calculate a rate of voltage change of the I6 region by comparing the voltage fluctuation rate of every cycle belonging to the I6 region of the first battery cell C1 with each other. Similarly, in FIG. 4, if the present cycle of the second battery cell C2 is 150 cycle, the control unit 103 may extract a voltage fluctuation rate of every cycle belonging to the J3 region including 101 to 150 cycles of the voltage fluctuation rate data pre-stored in the storing unit 105 for the second battery cell C2. The control unit 103 may calculate a rate of voltage change of the J3 region by comparing the voltage fluctuation rate of every cycle belonging to the J3 region of the second battery cell C2 with each other. Here, the rate of voltage change means a specific value for the rate of change.

Hereinafter, for convenience of description, it will be assumed that the rate of voltage change is a positive change rate if it is equal to or greater than 0 and the rate of voltage change is a negative change rate if it is smaller than 0. In addition, an example in which the control unit 103 calculates a rate of voltage change will be described in detail with reference to FIG. 5.

Figure 5:
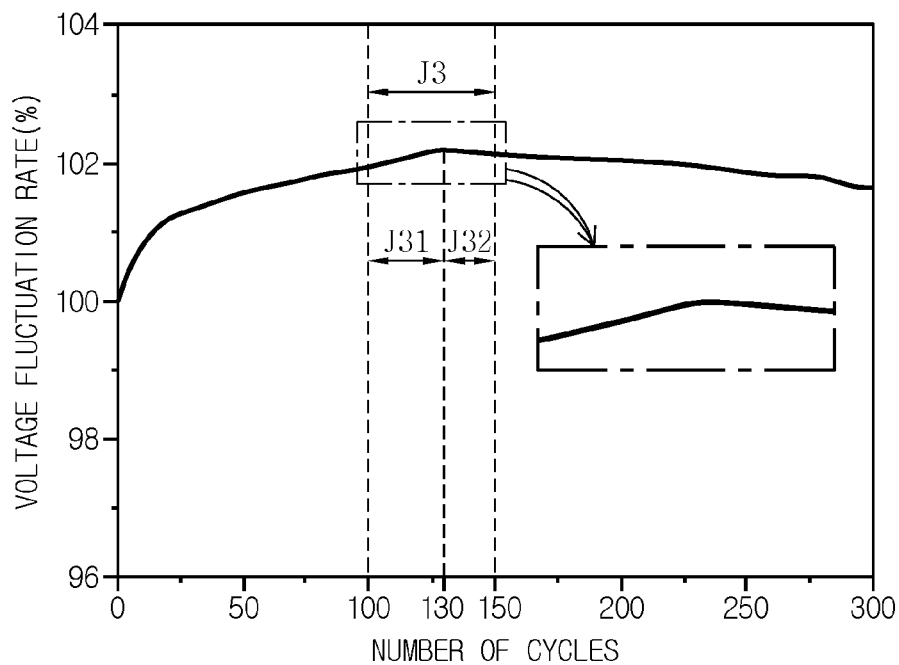
FIG. 5 is an enlarged view showing a region of the voltage fluctuation rate of the second battery cell, calculated by the battery state estimating apparatus according to an embodiment of the present disclosure.

FIG. 5 is an enlarged view showing a region of the voltage fluctuation rate of the second battery cell, calculated by the battery state estimating apparatus according to an embodiment of the present disclosure. That is, FIG. 5 is an enlarged view showing a voltage fluctuation rate included in the J3 region among voltage fluctuation rates calculated for the second battery cell C2.

Referring to the embodiment of FIG. 5, the control unit 103 may calculate a rate of voltage change of a voltage fluctuation rates included in a region to which the present cycle of the battery cell 11 belongs. At this time, the control unit 103 may divide the region to which the present cycle of the battery cell 11 belongs into a plurality of sub regions based on the rate of voltage change of the region to which the present cycle of the battery cell 11 belongs. Specifically, the control unit 103 may divide a single region into a plurality of sub regions based on a cycle at which the rate of voltage change calculated in one region changes from a positive change rate to a negative change rate or from a negative change rate to a positive change rate. For example, in the embodiment of FIG. 5, the control unit 103 may calculate an average rate of change for successive cycles included in the J3 region or an instantaneous rate of change for successive cycles included in the J3 region. Specifically, based on 130 cycle, the rate of voltage change of the J31 region may be calculated as a positive change rate, and the rate of voltage change of the J32 region may be calculated as a negative change rate. Accordingly, the control unit 103 may divide the J3 region of the second battery cell C2 into the J31 region and the J32 region based on 130 cycle.

That is, in the embodiment of FIG. 5, the control unit 103 may divide the J3 region into J31 and J32 regions and calculate the rate of voltage change for each of the J31 region and the J32 region. As such, the control unit 103 may divide one region into sub regions and calculate a rate of voltage change for each sub region.

When calculating a rate of change between voltage fluctuation rates included in a region to which the present cycle of the battery cell 11 belongs, the control unit 103 may not calculate the rate of change by regarding the region to which the present cycle belongs as just a single region. In addition, the control unit 103 may determine a cycle time point at which the rate of voltage change changes from positive to negative or from negative to positive, and divide the region to which the present cycle of the battery cell 11 belongs into sub regions based on the determined cycle time point.

As described above, the battery state estimating apparatus 100 according to an embodiment of the present disclosure does not determine that the region to which the present cycle of the battery cell 11 belongs is only one region indiscriminately, and if necessary, the battery state estimating apparatus 100 divides the region into sub regions and calculates a rate of voltage change in more detail, and thus there is an advantage in that the present state of the battery cell 11 may be more accurately determined.

In addition, the control unit 103 may determine a voltage increase and decrease pattern based on the calculated rate of voltage change. Here, the voltage increase and decrease pattern may include a voltage increase pattern and a voltage decrease pattern. In particular, the control unit 103 may determine the voltage increase and decrease pattern for the case where the calculated rate of change is a positive change rate as a voltage increase pattern. In addition, the control unit 103 may determine the voltage increase and decrease pattern when the calculated rate of change is a negative change rate as a voltage decrease pattern.

For example, referring to FIG. 3, if the present cycle of the first battery cell C1 belongs to the I1 region, the control unit 103 may calculate the rate of voltage change of the first battery cell C1 based on the voltage fluctuation rate included in the I1 region. In this case, the control unit 103 may calculate the rate of voltage change of the I1 region as a value less than zero. That is, the rate of voltage change of the I1 region may be calculated as a negative change rate. In addition, the control unit 103 may determine the present voltage increase and decrease pattern of the first battery cell C1 as a voltage decrease pattern based on the result that the rate of voltage change is calculated as a negative change rate. In addition, if the present cycle of the first battery cell C1 belongs to any one of the I2 to I6 regions, the control unit 103 may calculate a positive change rate based on the voltage fluctuation rate included in the corresponding region. Also, the control unit 103 may determine the present voltage increase and decrease pattern of the first battery cell C1 as a voltage increase pattern based on the calculated positive change rate.

For example, referring to FIG. 4, if the present cycle of the second battery cell C2 belongs to the J2 region, the control unit 103 may calculate a rate of voltage change based on the voltage fluctuation rate included in the J2 region. At this time, the control unit 103 may calculate the rate of voltage change of the J2 region as a value of 0 or more. That is, the rate of voltage change of the J2 region may be calculated as a positive change rate. In addition, the control unit 103 may determine the present voltage increase and decrease pattern of the second battery cell C2 as a voltage increase pattern based on the calculated rate of voltage change of the J2 region.

If the present cycle of the second battery cell C2 belongs to the J3 region, as shown in FIG. 5, the control unit 103 may divide the J3 region into a J31 region and a J32 region and calculate a rate of voltage change of each of the J31 region and the J32 region. The control unit 103 may calculate the rate of voltage change of the J31 region as a value of 0 or more and calculate the rate of voltage change of the J32 region as a value of less than 0. That is, the rate of voltage change of the J31 region may be calculated as a positive change rate, and the rate of voltage change of the J32 region may be calculated as a negative change rate. In addition, the control unit 103 may determine the voltage increase and decrease pattern of the J31 region as a voltage increase pattern and determine the voltage increase and decrease pattern of the J32 region as a voltage decrease pattern based on the calculated rate of voltage change.

That is, the battery state estimating apparatus 100 according to an embodiment of the present disclosure has an advantage of more accurately estimating a present state of the battery cell 11 in consideration of not only the present state of the battery cell 11 but also the previous state. In addition, since the battery state estimating apparatus 100 according to an embodiment of the present disclosure calculates the rate of voltage change of the battery cell 11 and determines the voltage increase and decrease pattern based on the rate of voltage change, it has an advantage of providing information from which a future state of the battery cell 11 may be easily estimated. In addition, even within a predetermined number of cycles from the present cycle, the voltage increase and decrease pattern of the battery cell 11 may be determined more specifically and in detail by dividing the region in which the rate of voltage change varies from negative to positive or from positive to negative into sub regions, and thus it is possible to more accurately estimate the present state of the battery cell 11.

The control unit 103 may determine the degradation acceleration degree of the battery cell 11 according to the voltage increase and decrease pattern of the battery cell 11 as any one of an accelerated degradation, a linear degradation and a decelerated degradation. Here, the accelerated degradation refers to a state in which the degradation of the battery cell 11 is gradually accelerated, and the linear degradation refers to a state in which the degradation of the battery cell 11 is not gradually accelerated like the accelerated degradation but is performed linearly. Conversely, the decelerated degradation refers to a state in which the degradation of the battery cell 11 is performed gradually slowly.

Hereinafter, the determination of the degradation acceleration degree according to the voltage increase and decrease pattern will be described.

If the voltage increase and decrease pattern is determined as a voltage increase pattern, the control unit 103 may be configured to determine the degradation acceleration degree of the battery cell 11 as any one of the accelerated degradation and the linear degradation according to the determined rate of change of the voltage increase pattern.

For example, as in the former embodiment, referring to FIG. 3, if the present cycle of the first battery cell C1 belongs to the I2 region, the control unit 103 may determine the voltage increase and decrease pattern of the first battery cell C1 as the voltage increase pattern. The control unit 103 may determine the present degradation acceleration degree of the first battery cell C1 as any one of the accelerated degradation and the linear degradation according to the rate of voltage change of the I2 region determined as the voltage increase pattern.

Similarly, as in the former embodiment, referring to FIG. 4, if the present cycle of the second battery cell C2 belongs to the J2 region, the control unit 103 may determine the voltage increase and decrease pattern of the second battery cell C2 as the voltage increase pattern. The control unit 103 may determine the degradation acceleration degree of the second battery cell C2 as any one of the accelerated degradation and the linear degradation according to the rate of voltage change of the J2 region determined as the voltage increase pattern. In addition, if the voltage increase and decrease pattern is determined as the voltage decrease pattern, the control unit 103 may be configured to determine the degradation acceleration degree of the battery cell 11 as the decelerated degradation.

For example, as in the former embodiment, referring to FIG. 3, if the present cycle of the first battery cell C1 belongs to the I1 region, the control unit 103 may determine the voltage increase and decrease pattern of the first battery cell C1 as the voltage decrease pattern. The control unit 103 may determine the degradation acceleration degree of the first battery cell C1 as the decelerated degradation according to the rate of voltage change of the I1 region of the first battery cell C1 determined as the voltage decrease pattern.

Similarly, as in the former embodiment, referring to FIG. 4, if the present cycle of the second battery cell C2 belongs to the J4 region, the control unit 103 may determine the voltage increase and decrease pattern of the second battery cell C2 as the voltage decrease pattern. The control unit 103 may determine the degradation acceleration degree of the second battery cell C2 as the decelerated degradation according to the rate of voltage change of the J4 region of the second battery cell C2 determined as the voltage decrease pattern. Since the battery state estimating apparatus 100 according to an embodiment of the present disclosure determines the degradation acceleration degree of the battery cell 11 in detail as the accelerated degradation, the linear degradation or the decelerated degradation according to the voltage increase and decrease pattern and the rate of voltage change of the battery cell 11, there is an advantage of accurately determining and diagnosing the present state of the battery cell 11.

In addition, if the voltage increase and decrease pattern is determined as the voltage decrease pattern, the battery state estimating apparatus 100 determines the degradation acceleration degree of the battery cell 11 only as the decelerated degradation, thereby saving the time required to determine the degradation acceleration degree.

Among the degradation acceleration degrees of the battery cell 11, the accelerated degradation and the linear degradation may be distinguished according to how fast the battery cell 11 is degraded. Hereinafter, the criteria for distinguishing the accelerated degradation and the linear degradation will be described.

The control unit 103 may be configured to determine the degradation acceleration degree of the battery cell 11 as the accelerated degradation if the calculated rate of voltage change is greater than or equal to a preset reference rate of voltage change. Conversely, if the calculated rate of voltage change is smaller than the preset reference rate of voltage change, the control unit 103 may be configured to determine the degradation acceleration degree of the battery cell 11 as the linear degradation. Here, the preset reference rate of voltage change is a reference rate of change for determining the degradation acceleration degree as any one of the accelerated degradation and the linear degradation, when the voltage increase and decrease pattern of the battery cell 11 is determined as a voltage increase pattern.

For example, in the embodiment shown in FIGS. 3 and 4, the preset reference rate of voltage change may be preset such that the voltage fluctuation rate increases by 1% at every 50 cycles. For example, in the embodiment shown in FIG. 3, if the present cycle of the first battery cell C1 belongs to any one of the I2, I3, I4, I5 and I6 regions, the control unit 103 may compare the rate of voltage change of the region to which the present cycle of the first battery cell C1 belongs with the preset reference rate of voltage change. Since the rate of voltage change of each of the I2, I3, I4, I5 and I6 regions is smaller than the preset reference rate of voltage change, the control unit 103 may determine the degradation acceleration degree of the first battery cell C1 as the linear degradation.

Similarly, in the embodiment shown in FIG. 4, if the present cycle of the second battery cell C2 belongs to any one of the J1, J2 and J3 regions, the control unit 103 may compare the rate of voltage change of the region to which the present cycle of the second battery cell C2 belongs with the preset reference rate of voltage change. Preferably, referring to FIGS. 4 and 5, if the present cycle of the second battery cell C2 belongs to any one of J1, J2 and J31 region, the control unit 103 may compare the rate of voltage change of the region to which the present cycle of the second battery cell C2 belongs with the preset reference rate of voltage change.

Figure 6:
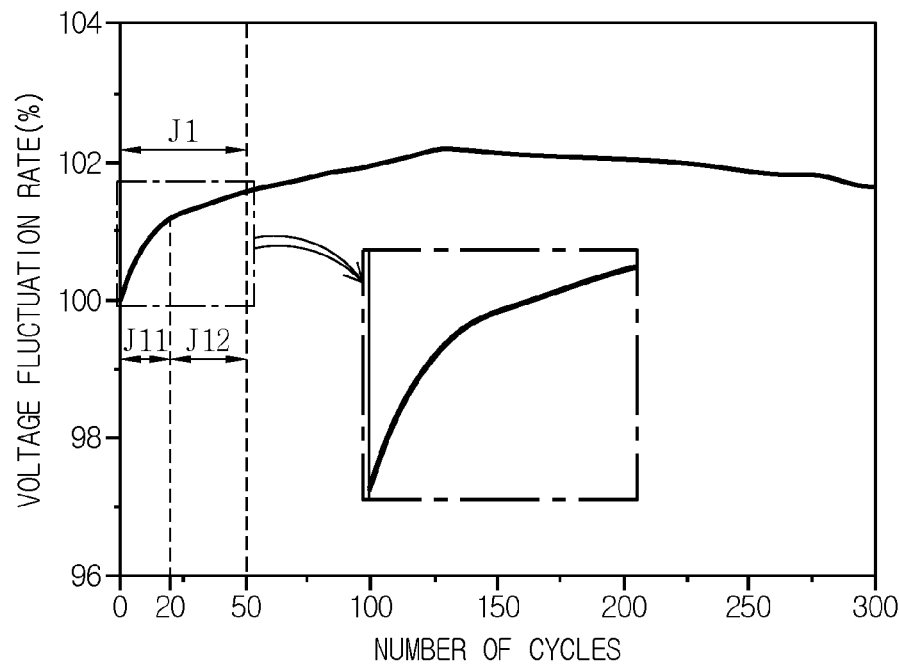
FIG. 6 is an enlarged view showing another region of the voltage fluctuation rate of the second battery cell, calculated by the battery state estimating apparatus according to an embodiment of the present disclosure.

Here, the control unit 103 may divide the J1 region into a J11 region and a J12 region based on the rate of voltage change of the J1 region. FIG. 6 is an enlarged view showing another region of the voltage fluctuation rate of the second battery cell, calculated by the battery state estimating apparatus according to an embodiment of the present disclosure. That is, FIG. 6 is an enlarged view showing a voltage fluctuation rate included in the J1 region among the voltage fluctuation rates calculated for the second battery cell C2. In the process of calculating the rate of voltage change of the J1 region, the control unit 103 may divide the J1 region into the J11 region and the J12 region based on a point where the rate of voltage change rapidly changes. That is, the control unit 103 may divide one region into a sub region in which the calculated rate of voltage change is greater than or equal to the preset reference rate of voltage change and a sub region in which the calculated rate of voltage change is smaller than the preset reference rate of voltage change. Here, it is assumed that the rate of voltage change of the J11 region is greater than the preset reference rate of voltage change, and the rate of voltage change of the J12 region is smaller than the preset reference rate of voltage change. For example, the control unit 103 may divide the J1 region into the J11 and J12 regions based on 20 cycle. That is, the J11 region and the J12 region may be sub regions of the J1 region.

For example, if the present cycle of the second battery cell C2 belongs to the J11 region, the control unit 103 may calculate the rate of voltage change of the J11 region, compare the calculated rate of voltage change with the preset reference rate of voltage change, and determine the degradation acceleration degree of the second battery cell C2 as the accelerated degradation. Conversely, if the present cycle of the second battery cell C2 belongs to the J12 region, the control unit 103 may calculate the rate of voltage change of the J12 region, compare the calculated rate of voltage change with the preset reference rate of voltage change, and determine the degradation acceleration degree of the second battery cell C2 as the linear degradation.

That is, the battery state estimating apparatus 100 according to an embodiment of the present disclosure may compare the preset reference rate of voltage change with the rate of voltage change of the region to which the present cycle of the battery cell 11 belongs, and determine the degradation acceleration degree by subdividing the same into any one of the accelerated degradation and the linear degradation, without indiscriminately determining the degradation acceleration degree for the voltage increase pattern. Therefore, the present state of the battery cell 11 may be further subdivided and specifically diagnosed.

The control unit 103 may be configured to determine the voltage increase and decrease pattern of the battery cell 11 only when the voltage fluctuation rate calculated for the battery cell 11 is greater than a preset lower voltage limit and smaller than a preset upper voltage limit. That is, the control unit 103 may determine the voltage increase and decrease pattern only when the voltage fluctuation rate of the battery cell 11 is within a certain range. For example, if the voltage fluctuation rate of the battery cell 11 is greater than or equal to the preset upper voltage limit, this is the case where the OCV of the battery cell 11 increases to a reference value or above, at which the battery cell 11 may abnormally degrades and have a sudden drop risk. In addition, if the voltage fluctuation rate of the battery cell 11 is smaller than or equal to the preset lower voltage limit, this is the case where the OCV of the battery cell 11 decreases to a reference value or below due to an electric short circuit or the like and the battery cell 11 may be abnormally degraded. Therefore, the control unit 103 may determine the voltage increase and decrease pattern for the case where the battery cell 11 is normally degraded, except for the case where the battery cell 11 is degraded abnormally.

If the normal or abnormal state of the battery cell 11 is not distinguished in advance, the degradation acceleration degree may be determined according to the voltage increase and decrease pattern in an abnormal state, and the battery control condition may be adjusted according to the determined degradation acceleration degree, which may further deteriorate the state of the battery cell 11. Accordingly, since the battery state estimating apparatus 100 according to an embodiment of the present disclosure first divides the state of the battery cell 11 into a normal state or an abnormal state and then determines the voltage increase and decrease pattern and the degradation acceleration degree only when the state of the battery cell 11 is a normal state, it is possible to shorten the time required to determine the degradation acceleration degree of the battery cell 11 and to improve the accuracy of determining the state of the battery cell 11.

The control unit 103 may also determine the degradation acceleration degree of the battery cell 11 not only based on the voltage fluctuation rate of the battery cell 11 but also based on an electric resistance fluctuation rate. Hereinafter, the degradation acceleration degree determined based on the electric resistance fluctuation rate will be described in detail.

The control unit 103 may calculate the electric resistance fluctuation rate based on the OCV of the battery cell 11 measured by the voltage measuring unit 101 and the pre-stored reference resistance. Specifically, the control unit 103 may receive the measured OCV from the voltage measuring unit 101 and calculate the present resistance of the battery cell 11 from the received OCV.

For example, the control unit 103 may calculate the present resistance of the battery cell 11 according to the calculation formula of "(|CCVEoD−OCVEoD|)÷it1". Here, CCVEoD may refer to a charge or discharge voltage of the battery cell 11 measured after a time point t1 from the time point where the OCVEoD of the battery cell 11 is measured, OCVEoD may refer to the OCV of the battery cell 11 measured when the voltage of the battery cell 11 reaches the reference discharge voltage in a discharge situation, and it1 may refer to an amount of charge or discharge current that has flowed for the time t1.

The pre-stored reference resistance is a reference value to be compared with the present resistance of the battery cell 11 calculated by the control unit 103, and may be a value stored in the storing unit 105 in advance. For example, the pre-stored reference resistance may be a resistance of the battery cell 11 measured at a predetermined cycle. The control unit 103 may calculate the electric resistance fluctuation rate as a ratio or a difference of the resistance of the present battery cell 11 to the pre-stored reference resistance.

For example, for the first battery cell C1 shown in FIG. 1, it is assumed that the pre-stored reference resistance is A2 [Ω]. Also, it is assumed that the present resistance of the first battery cell C1 calculated by the control unit 103 is B2 [Ω] based on the OCV of the first battery cell C1 measured by the voltage measuring unit 101 at the first time point. The control unit 103 may calculate the electric resistance fluctuation rate of the first battery cell C1 at the first time point as the ratio of B2 [Ω] to A2 [Ω]. For example, the electric resistance fluctuation rate of the first battery cell C1 at the first time point may be calculated using the calculation formula of "(B2÷A2)×100".

The control unit 103 may determine the resistance increase and decrease pattern based on the calculated electric resistance fluctuation rate and the pre-stored electric resistance fluctuation rate data. Here, the pre-stored electric resistance fluctuation rate data is reference data for comparison with the calculated electric resistance fluctuation rate, and may be stored in the storing unit 105 in advance. The control unit 103 may update the pre-stored electric resistance fluctuation rate data by adding the calculated electric resistance fluctuation rate to the pre-stored electric resistance fluctuation rate data. In addition, the control unit 103 may determine the resistance increase and decrease pattern based on the updated electric resistance fluctuation rate data.

For example, the pre-stored electric resistance fluctuation rate data may be data in which electric resistance fluctuation rates calculated in the past by the control unit 103 are stored. In this case, the control unit 103 may determine the resistance increase and decrease pattern of the battery cell 11 based on all electric resistance fluctuation rates calculated from the predetermined cycle at which the reference resistance is calculated. The resistance increase and decrease pattern may include various patterns such as a resistance increase pattern, a resistance decrease pattern and a resistance constant pattern. Hereinafter, for convenience of description, it will be assumed that the resistance increase and decrease pattern includes a resistance increase pattern and a resistance decrease pattern, and the resistance increase pattern includes patterns such as a constant resistance pattern excluding the resistance decrease pattern.

In addition, the control unit 103 may be configured to determine the degradation acceleration degree of the battery cell 11 according to the determined voltage increase and decrease pattern and the determined resistance increase and decrease pattern. Here, as described above, the degradation acceleration degree may be information indicating whether the degradation of the battery cell 11 is getting faster or slower. That is, the control unit 103 may determine the voltage increase and decrease pattern and the resistance increase and decrease pattern for each battery cell 11 included in the battery module 10, and determine the degradation acceleration degree of each battery cell 11 based on the determined voltage increase and decrease pattern and the determined resistance increase and decrease pattern.

For example, in the embodiment shown in FIG. 1, the control unit 103 may determine the voltage increase and decrease pattern and the resistance increase and decrease pattern of the first battery cell C1, and determine the degradation acceleration degree of the first battery cell C1 according to the determined voltage increase and decrease pattern and the determined resistance increase and decrease pattern. Similarly, control unit 103 may also determine the voltage increase and decrease pattern and the resistance increase and decrease pattern for the second battery cell C2, the third battery cell C3 and the fourth battery cell C4, and determine the degradation acceleration degree according to the determined voltage increase and decrease pattern and the determined resistance increase and decrease pattern.

The battery state estimating apparatus 100 according to an embodiment of the present disclosure may determine the degradation acceleration degree of the battery cell 11 not only based on the voltage fluctuation rate but also based on the electric resistance fluctuation rate. Therefore, the battery state estimating apparatus 100 has an advantage of more effectively and accurately determining the state of the battery cell 11 by complexly determining the state including the degradation acceleration degree of the battery cell 11 through various indexes. In addition, since the battery state estimating apparatus 100 according to an embodiment of the present disclosure may provide information that allows to determine or estimate past, present and future states of the battery cell 11 through various indexes, it is possible to provide information that allows to manage the battery cell 11 more effectively.

In particular, the control unit 103 may independently determine the degradation acceleration degree for each battery cell 11.

For example, in the embodiment shown in FIG. 1, the control unit 103 may determine the voltage increase and decrease pattern and the resistance increase and decrease pattern separately for each of the first battery cell C1, the second battery cell C2, the third battery cell C3 and the fourth battery cell C4. In addition, the control unit 103 may determine the degradation acceleration degree separately for each of the first battery cell C1, the second battery cell C2, the third battery cell C3 and the fourth battery cell C4 according to the determined voltage increase and decrease pattern and the determined resistance increase and decrease pattern.

That is, since the battery state estimating apparatus 100 according to an embodiment of the present disclosure may independently determine the degradation acceleration degree of each battery cell 11, the degree of degradation of each battery cell 11 may be estimated later according to the degradation acceleration degree of the battery cells 11, and the control conditions of each battery cell 11 may be adjusted according to the estimated degree of degeneration.

Preferably, the pre-stored reference resistance may include a reference resistance calculated based on the reference voltage pre-stored in the storing unit 105. That is, the pre-stored reference resistance corresponds to the pre-stored reference voltage, and may be a resistance calculated based on the OCV when the battery cell 11 is discharged at a predetermined cycle so that the voltage of the battery cell 11 reaches the reference discharge voltage. The pre-stored reference resistance may be stored in the storing unit 105.

For example, in the storing unit 105, a reference voltage A1 [V] may be pre-stored, and a reference resistance A2 [Ω] calculated based on the reference voltage A1 [V] may be pre-stored.

Preferably, the pre-stored electric resistance fluctuation rate data may be configured to include electric resistance fluctuation rates calculated by the control unit 103 whenever OCV is measured by the voltage measuring unit 101. That is, from the predetermined cycle before the present cycle, the voltage measuring unit 101 may measure the OCV when the voltage of the battery cell 11 reaches the reference discharge voltage by discharging. In addition, the control unit 103 may calculate the present resistance based on the OCV measured by the voltage measuring unit 101, and calculate the electric resistance fluctuation rate of the battery cell 11 according to the calculated present resistance and the reference resistance pre-stored in the storing unit 105. Further, the calculated electric resistance fluctuation rate may be included in the electric resistance fluctuation rate data pre-stored in the storing unit 105.

For example, in the embodiment shown in FIG. 1, the electric resistance fluctuation rate data pre-stored for the first battery cell C1 may include electric resistance fluctuation rates of the first battery cell C1 calculated from the first time point to the N-1$^{th}$ time point. Here, N is an integer of 2 or more, and when N is 2, the pre-stored electric resistance fluctuation rate data may include only the electric resistance fluctuation rate of the first battery cell C1 calculated at the first time point. If the electric resistance fluctuation rate of the first battery cell C1 is calculated at the N$^{th}$ time point by the control unit 103, the electric resistance fluctuation rate of the first battery cell C1 calculated at the N$^{th}$ time point may be included the electric resistance fluctuation rate data pre-stored in the storing unit 105. In this case, the electric resistance fluctuation rate data pre-stored in the storing unit 105 may include first to N$^{th}$ electric resistance fluctuation rates.

The battery state estimating apparatus 100 according to an embodiment of the present disclosure may determine the present resistance increase and decrease pattern of the battery cell 11 based on the electric resistance fluctuation rate data pre-stored in the storing unit 105 from the past time point to the present time point. That is, the battery state estimating apparatus 100 according to an embodiment of the present disclosure may determine the present resistance increase and decrease pattern of the battery cell 11 based on the pre-stored electric resistance fluctuation rate data in which electric resistance fluctuation rates calculated in the past are accumulatively stored. In addition, since the battery state estimating apparatus 100 determines the present degradation acceleration degree of the battery cell 11 based on the determined resistance increase and decrease pattern and the determined voltage increase and decrease pattern, the degradation acceleration degree or the degradation degree of the battery cell 11 may be more accurately determined, compared to the case where the degradation degree of the battery cell 11 is determined only by the electric resistance fluctuation rate at a specific time point.

In addition, since the determined degradation acceleration degree and the determined degradation degree may be utilized as information for estimating a future state of the battery cell 11, the battery state estimating apparatus 100 according to an embodiment of the present disclosure has an advantage of providing information capable of estimating a future state based on the degradation acceleration degree as well as past and present states of the battery cell 11.

The control unit 103 may calculate a rate of resistance change of a plurality of electric resistance fluctuation rates included within a predetermined number of cycles from the present cycle of the battery cell 11 among the pre-stored electric resistance fluctuation rate data. Here, the rate of resistance change may include an average rate of change or an instantaneous rate of change of the electric resistance fluctuation rates. In addition, the plurality of electric resistance fluctuation rates included within a predetermined number of cycles from the present cycle may include a plurality of electric resistance fluctuation rates included within a preset number of cycles from the present cycle. For example, the control unit 103 may calculate a rate of resistance change of a plurality of electric resistance fluctuation rates included within 50 cycles from the present cycle. The calculation of the rate of resistance change will be described in detail with reference to FIGS. 7 and 8.

Figure 7:
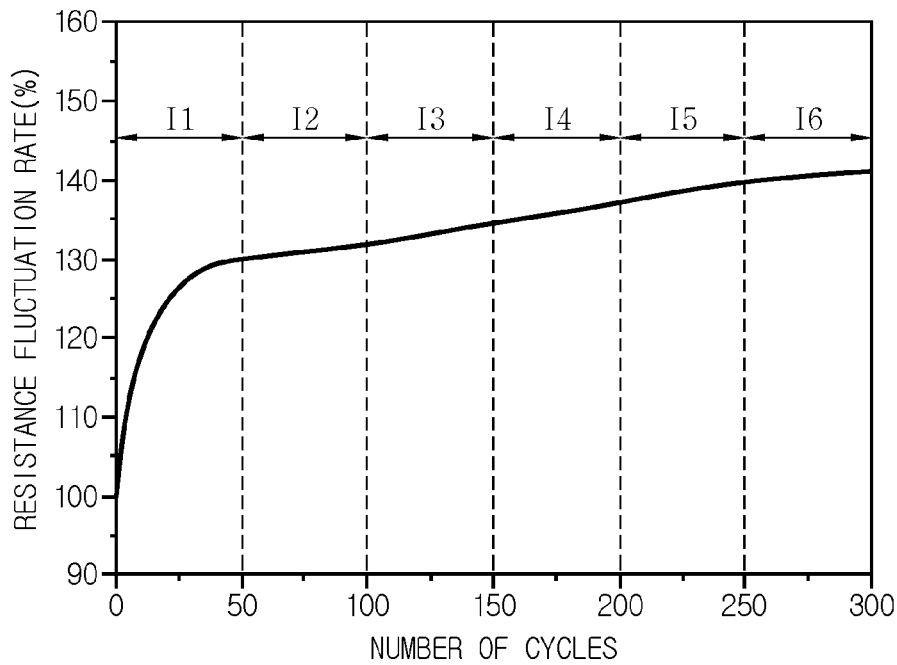
FIG. 7 is a diagram showing an electric resistance fluctuation rate of the first battery cell, calculated by the battery state estimating apparatus according to an embodiment of the present disclosure.
Figure 8:
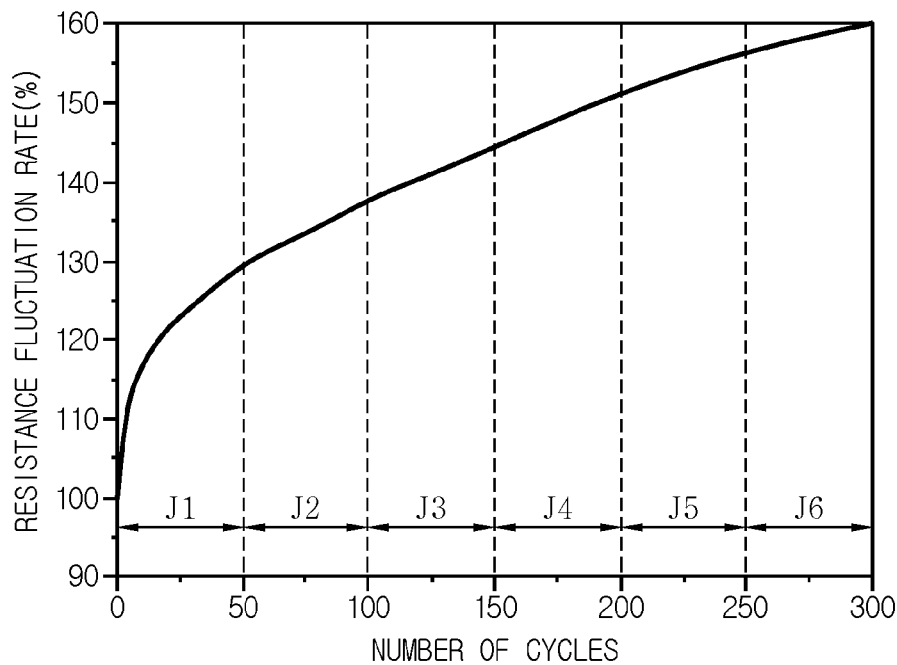
FIG. 8 is a diagram showing an electric resistance fluctuation rate of the second battery cell, calculated by the battery state estimating apparatus according to an embodiment of the present disclosure.

FIG. 7 is a diagram showing an electric resistance fluctuation rate of the first battery cell, calculated by the battery state estimating apparatus according to an embodiment of the present disclosure. FIG. 8 is a diagram showing an electric resistance fluctuation rate of the second battery cell, calculated by the battery state estimating apparatus according to an embodiment of the present disclosure. Referring to FIGS. 7 and 8, the storing unit 105 may store electric resistance fluctuation rate data pre-stored for the first battery cell C1 and electric resistance fluctuation rate data pre-stored for the second battery cell C2 at every cycle, respectively. Hereinafter, as shown in FIG. 7, a region including a preset number of cycles for the first battery cell C1 is described as an In region. Similarly, as shown in FIG. 8, a region including a preset number of cycles for the second battery cell C2 is described as a Jn region. Here, the In region shown in FIG. 7 may correspond to the In region shown in FIG. 3, and the Jn region shown in FIG. 8 may correspond to the Jn region shown in FIG. 4.

For example, it is assumed that the number of cycles preset to be included in one region is 50. In FIG. 7, if the present cycle of the first battery cell C1 is 300 cycle, the control unit 103 may extract an electric resistance fluctuation rate of each cycle belonging to the I6 region including 251 to 300 cycles of the electric resistance fluctuation rate data pre-stored in the storing unit 105 for the first battery cell C1. That is, the control unit 103 may calculate the rate of resistance change of the I6 region by comparing the electric resistance fluctuation rates of the cycles belonging to the I6 region of the first battery cell C1 with each other.

Similarly, in FIG. 8, if the present cycle of the second battery cell C2 is 150 cycle, the control unit 103 may extract electric resistance fluctuation rates belonging to the J3 region including 101 to 150 cycles among the electric resistance fluctuation rate data pre-stored in the storing unit 105 for the second battery cell C2. The control unit 103 may calculate the rate of resistance change of the J3 region by comparing the electric resistance fluctuation rates of the cycles belonging to the J3 region of the second battery cell C2 with each other. Here, the rate of resistance change refers to a specific value for the rate of change.

Hereinafter, for convenience of description, it will be assumed that the rate of resistance change is a positive change rate when it is 0 or more and the rate of resistance change is a negative change rate when it is less than 0.

Similar to the example of calculating the rate of voltage change described with reference to FIG. 5, when calculating the rate of change of the electric resistance fluctuation rates included in the region to which the present cycle of the battery cell 11 belongs, the control unit 103 may not calculate the rate of resistance change by determining that the present cycle belongs to only one region. In addition, the control unit 103 may determine a cycle at which the rate of resistance change changes from positive to negative or from negative to positive, and divide the region to which the present cycle of the battery cell 11 belongs into sub regions based on the determined cycle. That is, the control unit 103 may divide a single region into a plurality of sub regions according to the rate of resistance change of the electric resistance fluctuation rates belonging to the single region and calculate a rate of resistance change for each of the divided sub regions.

As described above, since the battery state estimating apparatus 100 according to an embodiment of the present disclosure does not determine that the region to which the present cycle of the battery cell 11 belongs is only one region indiscriminately, and if necessary, the battery state estimating apparatus 100 divides the region into sub regions and calculates a rate of resistance change in more detail, and thus there is an advantage in that the present state of the battery cell 11 may be more accurately determined.

In addition, the control unit 103 may determine a resistance increase and decrease pattern based on the calculated rate of resistance change. Here, the resistance increase and decrease pattern may include a resistance increase pattern and a resistance decrease pattern. In particular, the control unit 103 may determine the resistance increase and decrease pattern for the case where the calculated rate of change is a positive change rate as a resistance increase pattern. In addition, the control unit 103 may determine the resistance increase and decrease pattern when the calculated rate of change is a negative change rate as a resistance decrease pattern.

For example, referring to FIG. 7, if the present cycle of the first battery cell C1 belongs to the I1 region, the control unit 103 may calculate the rate of resistance change of the first battery cell C1 based on the electric resistance fluctuation rate included in the I1 region. In this case, the control unit 103 may calculate the rate of resistance change of the I1 region to a value of 0 or more. That is, the rate of resistance change of the I1 region may be calculated as a positive change rate. In addition, the control unit 103 may determine the present resistance increase and decrease pattern of the first battery cell C1 as the resistance increase pattern based on the result that the rate of resistance change is calculated as the positive change rate. Similarly, even when the present cycle of the first battery cell C1 belongs to any one of the I2 to I6 regions, the control unit 103 may calculate the rate of resistance change as a positive change rate based on the electric resistance fluctuation rate included in the region. In addition, the control unit 103 may determine the present resistance increase and decrease pattern of the first battery cell C1 as the resistance increase pattern based on the result calculated as the positive change rate.

In another example, referring to FIG. 8, if the present cycle of the second battery cell C2 belongs to the J1 region, the control unit 103 may calculate the rate of resistance change of the J1 region based on the electric resistance fluctuation rate of each cycle included in the J1 region. At this time, the control unit 103 may calculate the rate of resistance change of the J1 region as a value of 0 or more. That is, the rate of resistance change of the J1 region may be calculated as a positive change rate. In addition, the control unit 103 may determine the present resistance increase and decrease pattern of the second battery cell C2 as the resistance increase pattern based on the calculated rate of resistance change of the J1 region. Similarly, even when the present cycle of the second battery cell C2 belongs to any one of the J2 to J6 regions, the control unit 103 may calculate the rate of resistance change as a positive change rate based on the electric resistance fluctuation rate included in the region. In addition, the control unit 103 may also determine the resistance increase and decrease pattern as the resistance increase pattern for the J2 to J6 regions calculated as the positive change rate.

That is, since the battery state estimating apparatus 100 according to an embodiment of the present disclosure determines the present resistance increase and decrease pattern of the battery cell 11 according to the calculated electric resistance fluctuation rate of the present cycle and the previous rate of resistance change stored in the pre-stored electric resistance fluctuation rate data, there is an advantage that the state of the battery cell 11 may be estimated by considering not only the present state of the battery cell 11 but also the previous state thereof. In addition, since the battery state estimating apparatus 100 according to an embodiment of the present disclosure calculates the rate of resistance change of the battery cell 11 and determines the resistance increase and decrease pattern based on the calculated rate of resistance change, there is an advantage of providing information that allows to easily estimate a future state of the battery cell 11.

The control unit 103 may determine the degradation acceleration degree of the battery cell 11 according to the resistance increase and decrease pattern of the battery cell 11 as any one of an accelerated degradation, a linear degradation and a decelerated degradation. Here, the accelerated degradation refers to a state in which the degradation of the battery cell 11 is gradually accelerated, and the linear degradation refers to a state in which the degradation of the battery cell 11 is not gradually accelerated like the accelerated degradation but is performed linearly. Conversely, the decelerated degradation refers to a state in which the degradation of the battery cell 11 is performed gradually slowly. Hereinafter, the determination of the degradation acceleration degree according to the voltage increase and decrease pattern will be described.

When the voltage increase and decrease pattern is determined as the voltage increase pattern and the resistance increase and decrease pattern is determined as the resistance increase pattern, the control unit 103 may be configured to determine the degradation acceleration degree of the battery cell 11 as any one of the accelerated degradation and the linear degradation according to the calculated rate of resistance change. In addition, when the voltage increase and decrease pattern is determined as the voltage increase pattern and the resistance increase and decrease pattern is determined as the resistance decrease pattern, the control unit 103 may be configured to determine the degradation acceleration degree of the battery cell 11 as the decelerated degradation. Specifically, in a discharge situation, the OCV may affect a change factor of resistance. For example, in the case of the voltage decrease pattern, or in the case of the voltage increase pattern and the resistance decrease pattern, it may be considered that OCV affects a change factor of resistance. Therefore, the control unit 103 may be configured to determine the degradation acceleration degree of the battery cell 11 according to the resistance increase and decrease pattern and the rate of resistance change only when OCV does not affect the change factor of resistance.

For example, in the embodiments of FIGS. 3 and 7, as in the former example, the control unit 103 may determine the voltage increase and decrease pattern of the first battery cell C1 as a voltage decrease pattern for the I1 region and as a voltage increase pattern for the I2 to I6 regions. In addition, the control unit 103 may determine the resistance increase and decrease pattern of the first battery cell C1 as the resistance increase pattern for all of the I1 to I6 regions. At this time, the control unit 103 may determine the degradation acceleration degree of the first battery cell C1 based on the calculated rate of resistance change of each region only for the I2 to I6 regions in which the voltage increase and decrease pattern is determined as a voltage increase pattern and the resistance increase and decrease pattern is determined as a resistance increase pattern. That is, the control unit 103 may select a region in which the degradation acceleration degree of the battery cell 11 may be determined only by the resistance increase and decrease pattern in consideration of the voltage increase and decrease pattern and the resistance increase and decrease pattern, and determine the degradation acceleration degree of the battery cell 11 only for the selected region according to the rate of resistance change. In the above example, the control unit 103 may select the I2 to I6 regions as a region in which the degradation acceleration degree of the first battery cell C1 may be determined only by the resistance increase and decrease pattern, and determine the degradation acceleration degree of the first battery cell C1 for each region as any one of the accelerated degradation and the linear degradation according to the rate of resistance change of each of the selected I2 to I6 regions.

In another example, referring to FIGS. 4, 5 and 8, as in the former example, the control unit 103 may determine the voltage increase and decrease pattern of the second battery cell C2 as the voltage increase pattern for the J1 to J31 regions and as the voltage decrease pattern for the J32 to J7 regions. In addition, the control unit 103 may determine the resistance increase and decrease pattern of the second battery cell C2 as the resistance increase pattern for all of the J1 to J6 regions. At this time, in the control unit 103 may determine the degradation acceleration degree of the second battery cell C2 based on the calculated rate of resistance change of each region, only for the J1 to J31 regions for which the voltage increase and decrease pattern is determined as the voltage increase pattern and the resistance increase and decrease pattern is determined as the resistance increase pattern. That is, the control unit 103 may select the J1 to J31 as regions in which the degradation acceleration degree of the second battery cell C2 may be determined only using the resistance increase and decrease pattern, and determine the degradation acceleration degree of the second battery cell C2 for each region as any one of the accelerated degradation and the linear degradation based on the rate of resistance change of each of the selected J1 to J31 regions.

That is, in a discharge state of the battery cell 11, unlike the charge situation, the state of the battery cell 11 may be accurately diagnosed when a change factor of the resistance caused by OCV is put into consideration. Therefore, since the battery state estimating apparatus 100 according to an embodiment of the present disclosure determines the degradation acceleration degree of the battery cell 11 based on the electric resistance fluctuation rate in consideration of the change factor of the resistance in the discharge situation, the state for the degradation acceleration degree, the degradation degree, or the like of the battery cell 11 in the discharge situation may be more accurately determined.

As described above, among the degradation acceleration degrees of the battery cell 11, the accelerated degradation and the linear degradation may be distinguished according to how fast the battery cell 11 is degraded. The control unit 103 may be configured to determine the degradation acceleration degree of the battery cell 11 as the accelerated degradation, if the voltage increase and decrease pattern is the voltage increase pattern, the resistance increase and decrease pattern is the resistance increase pattern, and the calculated rate of resistance change is equal to or greater than a preset reference rate of resistance change. In addition, the control unit 103 may be configured to determine the degradation acceleration degree of the battery cell 11 as the linear degradation, if the voltage increase and decrease pattern is the voltage increase pattern, the resistance increase and decrease pattern is the resistance increase pattern, and the calculated rate of resistance change is smaller than the preset reference rate of resistance change. Conversely, if the voltage increase and decrease pattern is the voltage decrease pattern, or if the voltage increase and decrease pattern is the voltage increase pattern and the resistance increase and decrease pattern is the resistance decrease pattern, the control unit 103 may determine the degradation acceleration degree of the battery cell 11 based on the voltage increase and decrease pattern without considering the resistance increase and decrease pattern.

Here, the preset reference rate of resistance change is a reference rate of change for determining the degradation acceleration degree as any one of the accelerated degradation and the linear degradation, when the resistance increase and decrease pattern of the battery cell 11 is determined as the resistance increase pattern. For example, the preset reference rate of resistance change may be preset such that the electric resistance fluctuation rate increases by 10% at every 100 cycles.

For example, in the embodiment of FIGS. 3 and 7, if the present cycle of the first battery cell C1 belongs to any one of the I2 to I6 regions, the control unit 103 may compare the rate of resistance change of the region to which the present cycle of the first battery cell C1 belongs with the preset reference rate of resistance change. That is, since the I2 to I6 regions are regions where the voltage increase and decrease pattern is the voltage increase pattern and the resistance increase and decrease pattern is the resistance increase pattern, the control unit 103 may compare the rate of resistance change of the region to which the present cycle of the first battery cell C1 belongs with the preset reference rate of resistance change. Since the rate of resistance change of the I2 to I6 regions is smaller than the preset reference rate of resistance change, the control unit 103 may determine the degradation acceleration degree of the first battery cell C1 as the linear degradation.

Similarly, in the embodiment of FIGS. 4, 5 and 8, if the present cycle of the second battery cell C2 belongs to any one of the J1 to J31 regions, the control unit 103 may compare the rate of resistance change of the region to which the present cycle of the second battery cell C2 belongs with the preset reference rate of resistance change. That is, since the J1 to J31 regions are regions where the voltage increase and decrease pattern is the voltage increase pattern and the resistance increase and decrease pattern is the resistance increase pattern, the control unit 103 may compare the rate of resistance change of the region to which the present cycle of the second battery cell C2 belongs with the preset reference rate of resistance change. Since the rate of resistance change of the J1 to J31 regions is greater than the preset reference rate of resistance change, the control unit 103 may determine the degradation acceleration degree of the second battery cell C2 as the accelerated degradation.

For example, in the embodiment of FIGS. 3 to 8, the I1 region and the J32 to J6 regions are regions where the voltage increase and decrease pattern of the battery cell 11 is the voltage decrease pattern. Accordingly, the control unit 103 may determine the degradation acceleration degree based on the voltage increase and decrease pattern for the I1 region and the J32 to J6 regions, without determining the degradation acceleration degree based on the resistance increase and decrease pattern.

That is, the battery state estimating apparatus 100 according to an embodiment of the present disclosure may compare the preset reference rate of resistance change with the rate of resistance change and determine the degradation acceleration degree by subdividing the same into any one of the accelerated degradation and the linear degradation, without indiscriminately determining the degradation acceleration degree for the resistance increase pattern. Therefore, the present state of the battery cell 11 may be further subdivided and specifically diagnosed.

The control unit 103 may be configured to determine the voltage increase and decrease pattern of the battery cell 11 as the voltage increase pattern, and then determine the resistance increase and decrease pattern of the battery cell 11 only when the calculated electric resistance fluctuation rate exceeds a preset lower resistance limit. That is, the control unit 103 may determine the resistance increase and decrease pattern only when the voltage increase and decrease pattern of the battery cell 11 is the voltage increase pattern and the electric resistance fluctuation rate exceeds the preset lower resistance limit, and then determine the degradation acceleration degree of the battery cell 11 according to the determined resistance increase and decrease pattern. For example, as described above, in the discharge situation, if the voltage increase and decrease pattern of the battery cell 11 is the voltage decrease pattern, the OCV affects a factor that changes the resistance of the battery cell 11. In addition, if the electric resistance fluctuation rate of the battery cell 11 is smaller than or equal to the preset lower limit value, this refers to a case where the OCV and resistance of the battery cell 11 are reduced below reference values due to an electric short circuit or the like, which means that the battery cell 11 is abnormally degraded. Therefore, the control unit 103 may determine the resistance increase and decrease pattern only when the battery cell 11 is degraded normally, except the cases where the OCV affects the resistance change factor of the battery cell 11 and the battery cell 11 is degraded abnormally.

If the normal degradation or the abnormal degradation of the battery cell 11 are not distinguished in advance, the degradation acceleration degree is determined according to the resistance increase and decrease pattern in an abnormal degradation state, and the battery control condition is adjusted according to the determined degradation acceleration degree, which may further deteriorate the state of the battery cell 11. Therefore, the battery state estimating apparatus 100 according to an embodiment of the present disclosure determines the resistance increase and decrease pattern and the degradation acceleration degree only when the battery cell 11 is in a normal degradation state, thereby shortening the time required for determining the degrading acceleration degree of the battery cell 11 and improving the accuracy of determining the state of the battery cell 11.

Figure 9:
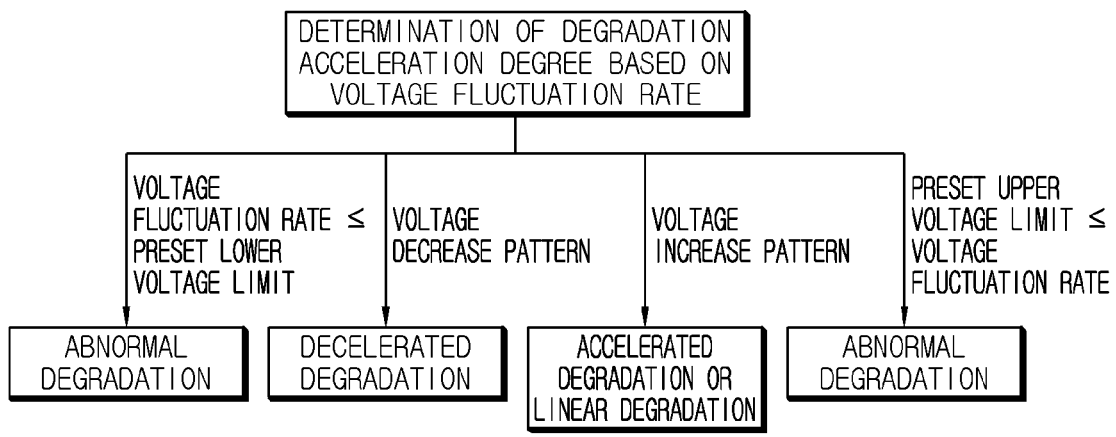
FIG. 9 is a diagram schematically showing a process of determining a degradation acceleration degree of a battery cell based on the voltage fluctuation rate by the battery state estimating apparatus according to an embodiment of the present disclosure in a tree structure.

FIG. 9 is a diagram schematically showing a process of determining a degradation acceleration degree of a battery cell based on the voltage fluctuation rate by the battery state estimating apparatus according to an embodiment of the present disclosure in a tree structure.

Referring to FIG. 9, the degradation acceleration degree of the battery cell 11 may be determined according to the voltage increase and decrease pattern of the battery cell 11 determined by the control unit 103.

First, if the voltage fluctuation rate of the battery cell 11 calculated by the control unit 103 is equal to or smaller than the preset lower voltage limit or equal to or greater than the preset upper voltage limit, it may be determined as abnormal degradation. If the battery cell 11 is determined to be abnormally degraded, the control unit 103 may not determine the voltage increase and decrease pattern based on the voltage fluctuation rate. That is, the control unit 103 may be configured to determine the voltage increase and decrease pattern only when the voltage fluctuation rate of the battery cell 11 is included in the normal range, and to determine the degradation acceleration degree of the battery cell 11 according to the determined voltage increase and decrease pattern.

If the voltage fluctuation rate of the battery cell 11 is greater than the preset lower voltage limit and smaller than the preset upper voltage limit, the control unit 103 may determine the voltage increase and decrease pattern of the battery cell 11 based on the calculated voltage fluctuation rate and the pre-stored voltage fluctuation rate data.

In addition, if the determined voltage increase and decrease pattern is the voltage decrease pattern, the control unit 103 may determine the degradation acceleration degree of the battery cell 11 as the decelerated degradation, and if the determined voltage increase and decrease pattern is the voltage increase pattern, the control unit 103 may determine the degradation acceleration degree of the battery cell 11 as any one of the accelerated degradation and the linear degradation. That is, if the determined voltage increase and decrease pattern is the voltage decrease pattern, the control unit 103 may determine the degradation acceleration degree of the battery cell 11 only as the decelerated degradation.

Conversely, if the determined voltage increase and decrease pattern is the voltage increase pattern, the control unit 103 may compare the rate of voltage change of the battery cell 11 with the preset reference rate of voltage change to classify the degradation acceleration degree of the battery cell 11 in more detail into any one of the accelerated degradation and the linear degradation.

Figure 10:
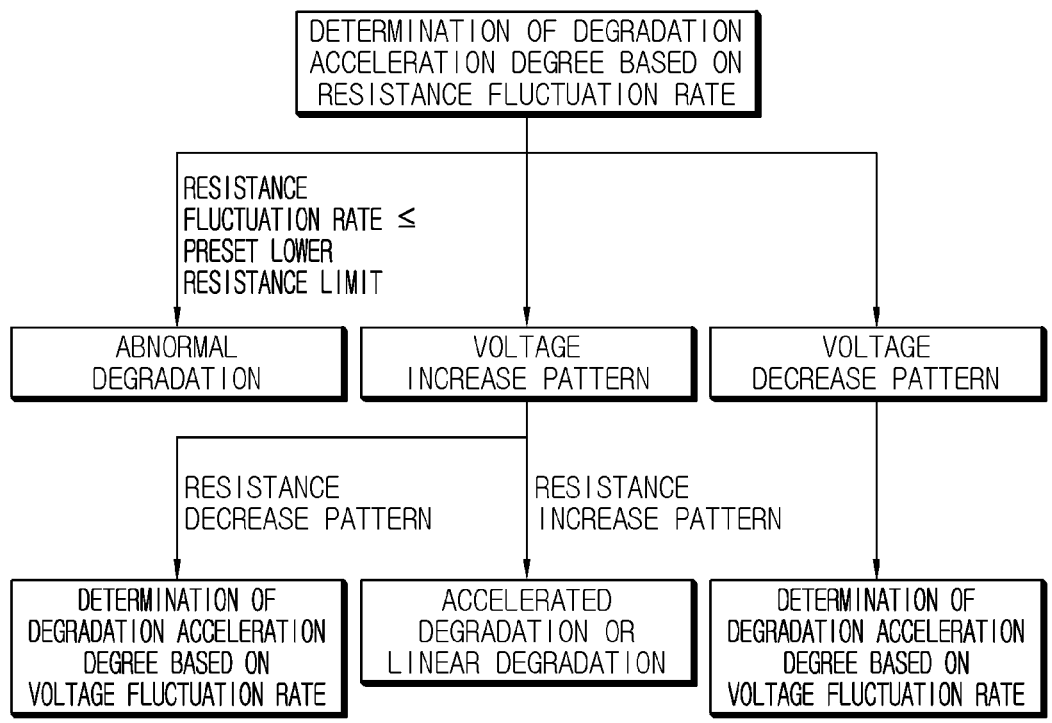
FIG. 10 is a diagram schematically showing a process of determining a degradation acceleration degree of a battery cell based on the electric resistance fluctuation rate by the battery state estimating apparatus according to an embodiment of the present disclosure in a tree structure.

FIG. 10 is a diagram schematically showing a process of determining a degradation acceleration degree of a battery cell based on the electric resistance fluctuation rate by the battery state estimating apparatus according to an embodiment of the present disclosure in a tree structure.

Referring to FIG. 10, the control unit 103 may determine the degradation acceleration degree of the battery cell 11 according to the determined voltage increase and decrease pattern and the determined resistance increase and decrease pattern of the battery cell 11.

First, the process of determining the degradation acceleration degree may be classified according to the voltage increase and decrease pattern of the battery cell 11 determined by the control unit 103.

If the electric resistance fluctuation rate of the battery cell 11 calculated by the control unit 103 is equal to or smaller than the preset lower resistance limit, the control unit 103 may determine the degradation state of the battery cell 11 as abnormal degradation. The control unit 103 may not determine the degradation acceleration degree of the battery cell 11 if the degradation state of the battery cell 11 is abnormal degradation, and the control unit 103 may determine the degradation acceleration degree of the battery cell 11 only when the degradation state of the battery cell 11 is normal degradation.

If the electric resistance fluctuation rate of the battery cell 11 calculated by the control unit 103 is greater than the preset lower resistance limit, the control unit 103 may consider the voltage increase and decrease pattern of the battery cell 11 first.

If the voltage increase and decrease pattern of the battery cell 11 is the voltage increase pattern, the control unit 103 may determine the resistance increase and decrease pattern based on the electric resistance fluctuation rate of the battery cell 11. Here, if the resistance increase and decrease pattern of the battery cell 11 is determined as the resistance decrease pattern, the control unit 103 may determine the degradation acceleration degree of the battery cell 11 based on the voltage fluctuation rate, as shown in FIG. 9.

If the resistance increase and decrease pattern of the battery cell 11 is the resistance decrease pattern, the control unit 103 may determine the degradation acceleration degree of the battery cell 11 only based on the voltage fluctuation rate and the voltage increase and decrease pattern of the battery cell 11.

Conversely, if the resistance increase and decrease pattern of the battery cell 11 is determined as the resistance increase pattern, the control unit 103 may determine the degradation acceleration degree of the battery cell 11 as any one of the accelerated degradation and the linear degradation based on the rate of resistance change. That is, only when the voltage increase and decrease pattern of the battery cell 11 is determined as the voltage increase pattern and the resistance increase and decrease pattern is determined as the resistance increase pattern, the control unit 103 may determine the present degradation acceleration degree of the battery cell 11 as any one of the accelerated degradation and the linear degradation based on the rate of resistance change of the region to which the present cycle of the battery cell 11 belongs.

The battery state estimating apparatus 100 according to an embodiment of the present disclosure may determine not only the degradation degree of the battery cell 11, namely the voltage fluctuation rate or the electric resistance fluctuation rate, but also the history of the degradation acceleration degree presently performed and the previous degradation acceleration degree. That is, the battery state estimating apparatus 100 according to an embodiment of the present disclosure may more accurately determine the present state of the battery cell 11 and further provide specific information that allows to predict a future situation such as the life of the battery cell 11.

In addition, the battery state estimating apparatus 100 according to an embodiment of the present disclosure may determine the degradation acceleration degree of the battery cell 11 in consideration of the specificity in the discharge situation where the OCV affects the resistance change factor while the battery cell 11 is being discharged. That is, the battery state estimating apparatus 100 may determine the degradation acceleration degree of the battery cell 11 only by the voltage increase and decrease pattern, and may also determine the degradation acceleration degree of the battery cell 11 by considering the voltage increase and decrease pattern and the resistance increase and decrease pattern in combination. Therefore, the battery state estimating apparatus 100 may more specifically determine the state of the battery cell 11 by determining the degradation acceleration degree of the battery cell 11 in diversified ways using various indicators such as the voltage increase and decrease pattern and the resistance increase and decrease pattern.

A battery pack 1000 according to the present disclosure may include the battery state estimating apparatus 100 according to the present disclosure described above. In addition, in addition to the battery state estimating apparatus 100, the battery pack 1000 according to the present disclosure may further include at least one battery cell 11, various electrical components (such as a battery management system (BMS), relays, fuses, and the like) and a pack case.

In addition, as another embodiment of the present disclosure, the battery state estimating apparatus 100 may be mounted to various devices using electric energy, such as an electric vehicle, an energy storage system (ESS), and the like. In particular, the battery state estimating apparatus 100 according to the present disclosure may be included in an electric vehicle. That is, the electric vehicle according to the present disclosure may include the battery state estimating apparatus 100 according to the present disclosure. Here, the battery state estimating apparatus 100 may be in the form included in the battery pack 1000, but may be implemented as a device separate from the battery pack 1000. For example, at least a portion of the battery state estimating apparatus 100 may be implemented by an electronic control unit (ECU) of the vehicle. In addition, in addition to the battery state estimating apparatus 100, the vehicle according to the present disclosure may include a chassis and electronic components that are typically provided in the vehicle. For example, in addition to the battery state estimating apparatus 100 according to the present disclosure, the vehicle according to the present disclosure may include a contactor, an inverter, a motor, at least one ECU, and the like. However, the present disclosure is not specially limited to other components of the vehicle other than the battery state estimating apparatus 100.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery module
11: battery cell
100: battery state estimating apparatus
1000: battery pack

What is claimed is:

1. A battery state estimating apparatus, comprising:
a voltage measuring unit configured to:
measure a voltage of a battery cell; and
compare the measured voltage of the battery cell to a predetermined reference discharge voltage value;
in response to the measured voltage equaling the predetermined reference discharge voltage value, measure an open circuit voltage (OCV) of the battery cell; and
a control unit configured to:
receive the OCV measured by the voltage measuring unit;
compare the received OCV with a pre-stored reference voltage;
calculate a voltage fluctuation rate according to the comparison between the received OCV and the pre-stored reference voltage;
determine either a voltage increase pattern or a voltage decrease pattern based on the calculated voltage fluctuation rate and pre-stored voltage fluctuation rate data; and
determine a degree of degradation of the battery cell according to the determined voltage increase pattern or voltage decrease pattern.

2. The battery state estimating apparatus according to claim 1,
wherein the pre-stored reference voltage is an OCV of the battery cell when the battery cell is discharged to the predetermined reference discharge voltage value during a predetermined cycle of the battery cell, and
wherein the pre-stored voltage fluctuation rate data includes a voltage fluctuation rate previously calculated by the control unit.

3. The battery state estimating apparatus according to claim 1,
wherein the control unit is configured to determine the voltage increase pattern or the voltage decrease pattern according to calculated voltage fluctuation rate and the pre-stored voltage fluctuation rate data based on the calculated voltage fluctuation rate being greater than a preset lower voltage limit and smaller than a preset upper voltage limit.

4. A battery pack, comprising the battery state estimating apparatus according to claim 1.

5. An electric vehicle, comprising the battery state estimating apparatus according to claim 1.

6. A battery state estimating apparatus, comprising:
a voltage measuring unit configured to:
measure a voltage of a battery cell; and
measure an open circuit voltage (OCV) of the battery cell whenever the measured voltage reaches a reference discharge voltage value; and
a control unit configured to:
receive the OCV measured by the voltage measuring unit;
compare the received OCV with a pre-stored reference voltage;
calculate a voltage fluctuation rate according to the comparison between the received OCV and the pre-stored reference voltage;
determine either a voltage increase pattern or a voltage decrease pattern based on the calculated voltage fluctuation rate and pre-stored voltage fluctuation rate data;
determine a degree to which degradation of the battery cell is changing according to the determined voltage increase pattern or voltage decrease pattern;
calculate a rate of voltage change between the voltage fluctuation rate calculated during a present cycle of the battery cell and a voltage fluctuation rate calculated during a previous cycle of the battery cell within a predetermined number of cycles from the present cycle of the battery cell, wherein the voltage fluctuation rate calculated during the previous cycle is included among the pre-stored voltage fluctuation rate data; and
determine the voltage increase pattern or voltage decrease pattern based on the calculated rate of voltage change.

7. The battery state estimating apparatus according to claim 6,
wherein the control unit is configured to:
determine the degree to which degradation of the battery cell is changing as one of an accelerated degradation or a linear degradation according to the voltage increase pattern determined from the calculated rate of voltage change; and
determine the degree to which degradation of the battery cell is changing as a decelerated degradation, according to the voltage decrease pattern determined from the calculated rate of voltage change.

8. The battery state estimating apparatus according to claim 7,
wherein the control unit is configured to:
determine the degree to which degradation of the battery cell is changing as the accelerated degradation based on the calculated rate of voltage change being equal to or greater than a preset reference rate of voltage change; and
determine the degree to which degradation of the battery cell is changing as the linear degradation based on the calculated rate of voltage change being smaller than the preset reference rate of voltage change.

9. A battery state estimating apparatus, comprising:
a voltage measuring unit configured to:
measure a voltage of a battery cell; and
measure an open circuit voltage (OCV) of the battery cell whenever the measured voltage reaches a reference discharge voltage value; and
a control unit configured to:
receive the OCV measured by the voltage measuring unit;
compare the received OCV with a pre-stored reference voltage;
calculate a voltage fluctuation rate according to the comparison between the received OCV and the pre-stored reference voltage;
determine either a voltage increase pattern or a voltage decrease pattern based on the calculated voltage fluctuation rate and pre-stored voltage fluctuation rate data;
compare the received OCV with a pre-stored reference resistance;

calculate an electric resistance fluctuation rate according to the comparison between the received OCV and the pre-stored reference resistance;

determine a resistance increase pattern or a resistance decrease pattern based on the calculated electric resistance fluctuation rate and pre-stored electric resistance fluctuation rate data; and determine the degree to which degradation of the battery cell is changing according to at least the determined resistance increase pattern or the determined resistance decrease pattern.

10. The battery state estimating apparatus according to claim 9, wherein the pre-stored reference resistance is calculated based on the pre-stored reference voltage, and wherein the pre-stored electric resistance fluctuation rate data includes an electric resistance fluctuation rate previously calculated by the control unit.

11. The battery state estimating apparatus according to claim 9, wherein the control unit is configured to:

calculate a rate of resistance change between the electric resistance fluctuation rate calculated during a present cycle of the battery cell and an electric resistance fluctuation rate calculated during a previous cycle of the battery cell within a predetermined number of cycles from the present cycle of the battery cell, wherein the electric resistance fluctuation rate calculated during the previous cycle of the battery cell is included among the pre-stored electric resistance fluctuation rate data; and determine the resistance increase pattern or the resistance decrease pattern based on the calculated rate of resistance change.

12. The battery state estimating apparatus according to claim 11, wherein the control unit is configured to determine the degree to which degradation of the battery cell is changing as one of an accelerated degradation or a linear degradation according to the calculated rate of resistance change according to the voltage increase pattern and the resistance increase pattern.

13. The battery state estimating apparatus according to claim 9, wherein the control unit is configured to determine the resistance increase pattern or the resistance decrease pattern according to the voltage increase pattern and the calculated electric resistance fluctuation rate being greater than a preset lower resistance limit.

* * * * *